(12) United States Patent
Chuang et al.

(10) Patent No.: US 8,623,756 B2
(45) Date of Patent: Jan. 7, 2014

(54) REFLOW SYSTEM AND METHOD FOR CONDUCTIVE CONNECTIONS

(75) Inventors: Chita Chuang, Kaohsiung (TW); Sheng-Yu Wu, Hsin-Chu (TW); Tin-Hao Kuo, Hsin-Chu (TW); Pei-Chun Tsai, Zhongli (TW); Ming-Da Cheng, Jhubei (TW); Chen-Shien Chen, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 288 days.

(21) Appl. No.: 13/167,257

(22) Filed: Jun. 23, 2011

(65) Prior Publication Data
US 2012/0329264 A1    Dec. 27, 2012

(51) Int. Cl.
*H01L 21/283*    (2006.01)

(52) U.S. Cl.
USPC .................... 438/614; 438/613; 257/E21.159

(58) Field of Classification Search
USPC .................... 438/613, 614; 257/E21.159
See application file for complete search history.

(56) References Cited

U.S. PATENT DOCUMENTS

| 2010/0089983 A1* | 4/2010 | MacKay et al. ............... 228/256 |
| 2011/0285015 A1* | 11/2011 | Song et al. .................... 257/737 |

* cited by examiner

*Primary Examiner* — Alexander Ghyka
*Assistant Examiner* — Stanetta Isaac
(74) *Attorney, Agent, or Firm* — Slater & Matsil, L.L.P.

(57) ABSTRACT

A system and method for forming conductive connections is disclosed. An embodiment comprises forming conductive material on to contacts of a semiconductor substrate. The semiconductor substrate is then inverter such that the conductive material is beneath the semiconductor substrate, and the conductive material is reflowed to form a conductive bump. The reflow is performed using gravity in order to form a more uniform shape for the conductive bump.

16 Claims, 4 Drawing Sheets

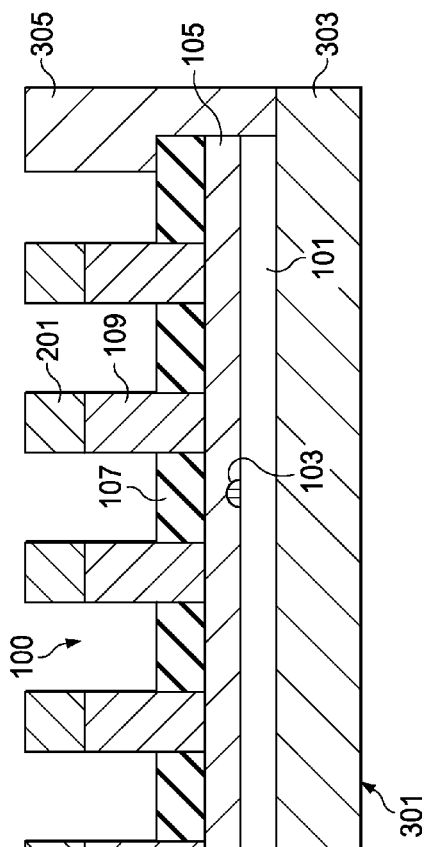
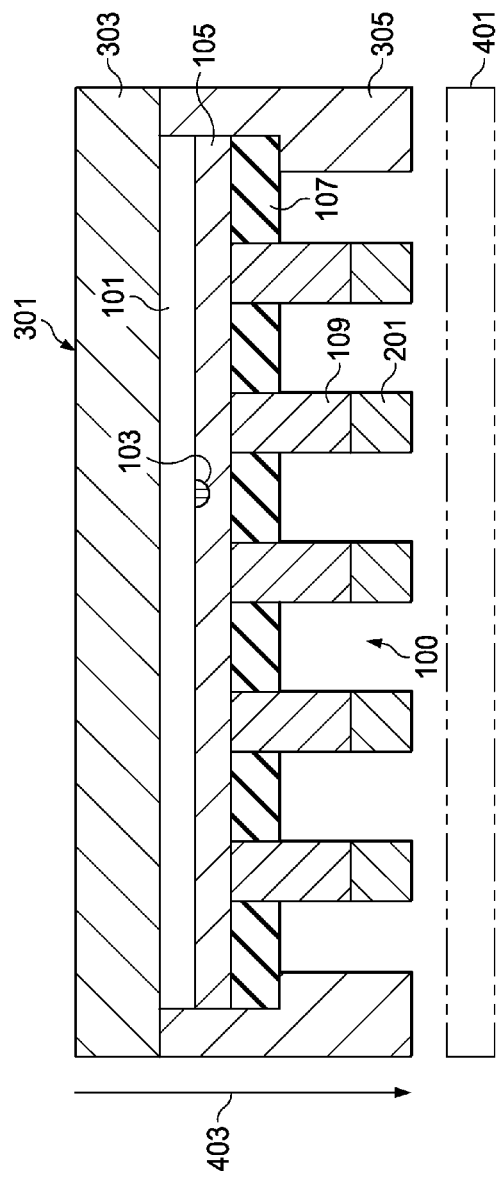

REFLOW SYSTEM AND METHOD FOR CONDUCTIVE CONNECTIONS

BACKGROUND

Conductive pillars may be formed on a semiconductor substrate in order to provide a physical and electrical connection for external connectors. These conductive pillars are generally formed through a top passivation layer of the semiconductor substrate, thereby providing an external connection to the active devices formed on the semiconductor substrate. The conductive pillars are formed through typical photolithographic and masking processes, and provide a surface for a conductive bump to be connected.

The conductive bump may be formed on the conductive pillars from a connecting material such as solder. Typically, the connective material may be placed onto the conductive pillars and then heated such that the connective material may partially liquefy and reflow into a bump shape due to the surface tension of the liquefied connective material. Once formed, the conductive bump may then be placed into contact with a separate substrate such as, for example, a printed circuit board or else another semiconductor substrate. After the conductive bump has been placed in contact, the conductive bump may again be reflowed in order to bond the conductive bump to the separate substrate, thereby providing not only an electrical connection between the semiconductor substrate and the separate substrate, but also providing a bonding mechanism between the semiconductor substrate and the separate substrate.

However, the reflow process generally proceeds with the conductive material being on top of the conductive pillar. As such, once the conductive material begins to liquefy, the force of gravity can interfere with the surface tension. This interference can result in a distortion of the bump as the force of gravity pulls the conductive material downwards against the conductive pillar, thereby distorting the overall bump shape.

BRIEF DESCRIPTION OF THE DRAWINGS

For a more complete understanding of embodiments, and the advantages thereof, reference is now made to the following descriptions taken in conjunction with the accompanying drawings, in which:

FIG. 3 illustrates the placement of the semiconductor wafer into a physical chuck in accordance with an embodiment;

FIG. 4 illustrates the inversion of the chuck and the semiconductor wafer in accordance with an embodiment;

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of embodiments are discussed in detail below. It should be appreciated, however, that the embodiments provides many applicable inventive concepts that can be embodied in a wide variety of specific contexts. The specific embodiments discussed are merely illustrative, and do not limit the scope of the embodiments.

The embodiments will be described with respect to embodiments in a specific context, namely a conductive bump connector for a semiconductor die. The embodiments may also be applied, however, to other conductive connections.

Figure 1:
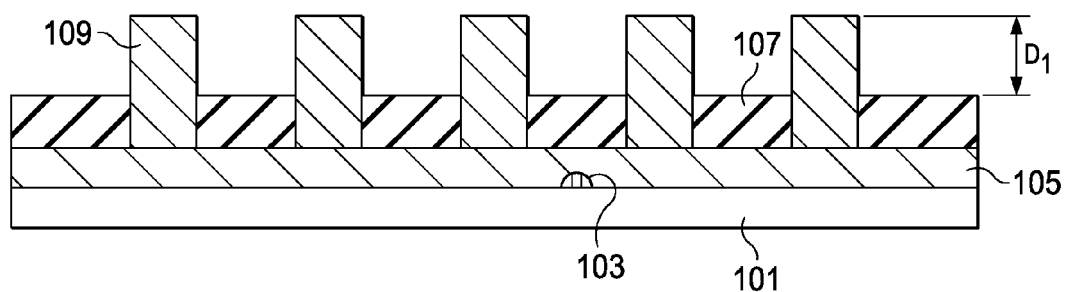
FIG. 1 illustrates a semiconductor wafer with active devices, a passivation layer, and conductive pillars in accordance with an embodiment.

With reference now to FIG. 1, there is shown a semiconductor wafer 100 onto which conductive bumps 501 (not shown in FIG. 1 but illustrated in FIG. 5 below) are desired to be formed. The semiconductor wafer 100 has a substrate 101, active devices 103, metallization layers 105, a passivation layer 107 and a series of conductive pillars 109. The substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the semiconductor wafer 100. The active devices 103 may be formed using any suitable methods either within or else on the surface of the substrate 101.

The metallization layers 105 are formed over the substrate 101 and the active devices 103 and are designed to connect the various active devices 103 to form functional circuitry. While illustrated in FIG. 1 as a single layer, the metallization layers 105 are formed of alternating layers of dielectric and conductive material and may be formed through any suitable process (such as deposition, damascene, dual damascene, etc.). In an embodiment there may be four layers of metallization separated from the substrate 101 by at least one interlayer dielectric layer (ILD), but the precise number of metallization layers 105 is dependent upon the design of the semiconductor wafer 100.

The passivation layer 107 may be formed on the metallization layers 105 over the active devices 103 in order to provide protection from physical and environmental harm that exposure may cause. The passivation layer 107 may be made of one or more suitable dielectric materials such as a polymer, silicon oxide, silicon nitride, low-k dielectrics such as carbon doped oxides, extremely low-k dielectrics such as porous carbon doped silicon dioxide, combinations of these, or the like. The passivation layer 107 may be formed through a process such as chemical vapor deposition (CVD), although any suitable process may be utilized, and may have a thickness between about 0.5 µm and about 5 µm, such as about 9.25 KÅ.

The conductive pillars 109 may be formed to provide conductive regions for contact between the metallization layers 105 and an external device 701 (not shown in FIG. 1 but illustrated and discussed below with respect to FIG. 7) such as printed circuit boards or other semiconductor dies in, e.g., a flip-chip arrangement. The pillar process may be formed by initially forming a first photoresist (not shown) over the passivation layer 107, and then patterning the first photoresist to expose portions of the passivation layer 107. Once patterned, the first photoresist may then be used as a mask to remove the desired portions of the passivation layer 107, thereby exposing those portions of the underlying metallization layers 105 to which the conductive pillars 109 will make contact.

After the passivation layer 107 has been patterned, the first photoresist may be removed and a second photoresist may be formed and patterned in the desired shape of the conductive pillars 109. Conductive materials may be deposited to form the conductive pillars 109 within the openings of both the passivation layer 107 as well as the second photoresist. The conductive pillars 109 may be formed from a conductive material such as copper, although other conductive materials such as nickel, titanium (Ti), vanadium (V), or aluminum (Al), combinations of these, and the like may also be used. Additionally, the conductive pillars 109 may be formed using a process such as electroplating, by a combination of current and immersion within a solution deposit, e.g., copper within the openings in order to fill and/or overfill the openings of the conductive pillar photoresist and the passivation layer 107, thereby forming the conductive pillars 109.

After the conductive pillars 109 have been formed, the photoresist may be removed through a process such as ashing, whereby the temperature of the photoresist is increased until the photoresist decomposes and may be removed. After the removal of the photoresist, the conductive pillars 109 extend away from the passivation layer 107 a distance $D_1$ of between about 5 μm to about 70 μm, such as about 40 μm. Optionally, a barrier layer (not shown) may be formed over the conductive pillars 109, for example, by electroless plating, wherein the barrier layer may be formed of nickel, vanadium (V), chromium (Cr), and combinations thereof.

However, as one of ordinary skill in the art will recognize, the above described process to form the conductive pillars 109 is merely one such description, and is not meant to limit the embodiments to this exact process. Rather, the described process is intended to be merely illustrative, and any other suitable process for forming the conductive pillars 109 may alternatively be utilized. All suitable processes are fully intended to be included within the scope of the present embodiments.

Figure 2:
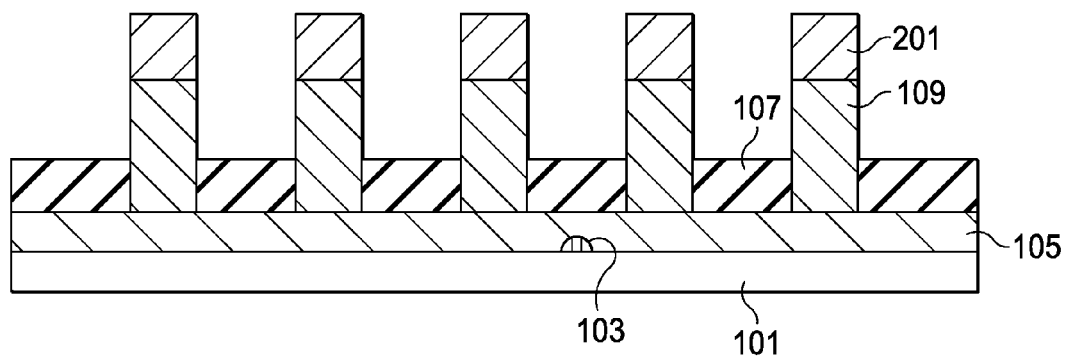
FIG. 2 illustrates the formation of conductive caps onto the conductive pillars in accordance with an embodiment.

FIG. 2 illustrates a cross-sectional view of the semiconductor wafer 100 after a conductive material 201 has been formed onto the conductive pillars 109. The conductive material 201 may comprise a material such as tin, or other suitable materials, such as silver, lead-free tin, or copper. In an embodiment in which the conductive material 201 is tin, the conductive material 201 may be formed by initially forming a layer of tin through such commonly used methods such as evaporation, electroplating, printing, etc., to a thickness of between about 10 μm and about 30 μm, such as about 20 μm.

FIG. 3 illustrates the placement of the semiconductor wafer 100 into a physical chuck 301 for further processing. In an embodiment the semiconductor wafer 100 may be placed onto a bottom portion 303 of a physical chuck 301 with the conductive pillars 109 facing away from the bottom portion 303. A top portion 305 of the physical chuck 301 may then be connected to the bottom portion 303 of the physical chuck 301, with the top portion 305 of the physical chuck 301 overlying and protecting edges of the semiconductor wafer 100 while also providing a sufficient grip to hold the semiconductor wafer 100. A series of one or more seals (not shown) may be used to ensure an adequate seal between the physical chuck 301 and the semiconductor wafer 100.

FIG. 4 illustrates that, once the semiconductor wafer 100 has been placed into and secured by the physical chuck 301, the physical chuck 301 and the semiconductor wafer 100 may be inverted such that the conductive material 201 hangs from the conductive pillars 109. The inversion may be achieved by simply applying a rotational force to the physical chuck 301, which thereby also rotates the semiconductor wafer 100. In an embodiment, the physical chuck 301 and the semiconductor wafer 100 are inverted into a position such that the top surface of the semiconductor wafer 100 is parallel with the ground (represented in FIG. 4 by the dashed box 401) and perpendicular to the pull of gravity (represented in FIG. 4 by the arrow 403).

Figure 5:
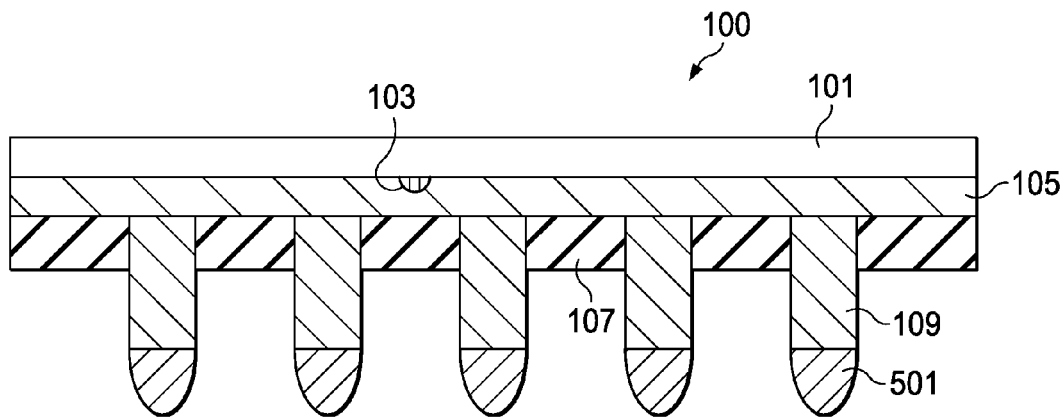
FIG. 5 illustrates a reflow process to form conductive bumps in accordance with an embodiment.

FIG. 5 illustrates that once the semiconductor wafer 100 and physical chuck 301 have been inverted, a reflow process may be performed to transform the conductive material 201 into conductive bumps 501. In the reflow process the temperature of the conductive material 201 is raised to a temperature of between about 200° C. and about 270° C., such as about 240° C. for a time of between about 30 seconds and about 150 seconds, such as 90 seconds, in order to at least partially liquefy the conductive material 201.

Once liquefied, the surface tension of the conductive material 201 will pull the conductive material 201 into a bump shape. Additionally, in an embodiment the force of gravity 403, instead of distorting the conductive material 201 onto the surface of the conductive pillars 109 and flattening the conductive bumps 501 as they form, actually applies a force and pulls the conductive material 201 away from the surface of the conductive pillars 109. By reversing this applied force from the force of gravity, the shape of the conductive bumps 501 forms a more uniform shape.

Figure 6:
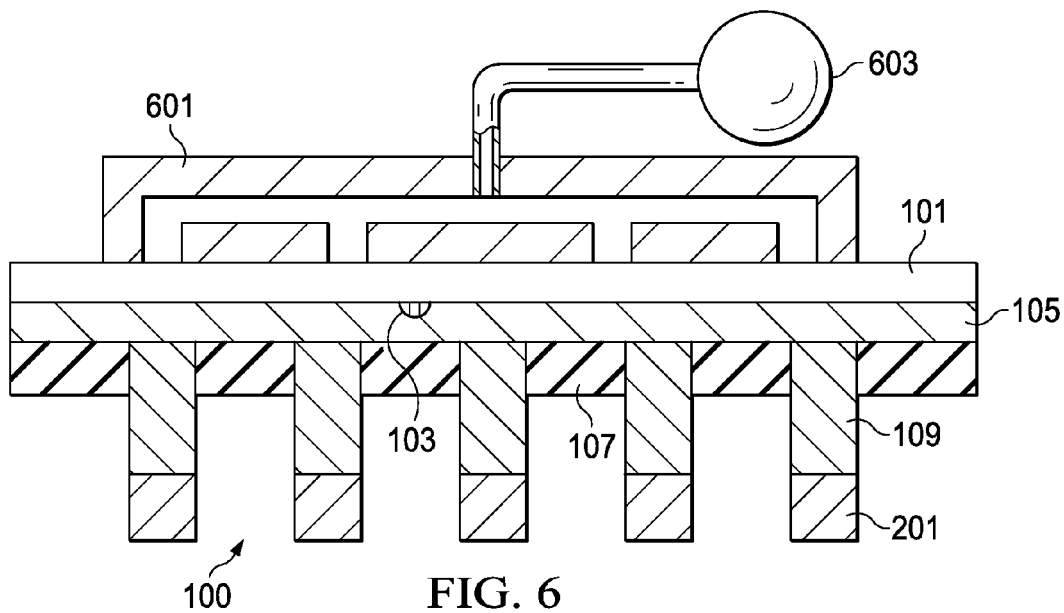
FIG. 6 illustrates an embodiment in which a vacuum chuck is utilized to maneuver the semiconductor wafer in accordance with an embodiment.

FIG. 6 illustrates another embodiment in which the physical chuck 301 is replaced with a vacuum chuck 601. The vacuum chuck 601, instead of relying upon the top portion 305 of the physical chuck 301 to apply pressure to hold the semiconductor wafer 100 to the physical chuck 301, instead utilizes a difference in pressure to hold the semiconductor wafer 100 to the vacuum chuck 601. As an example, the vacuum chuck 601 may be applied to the back side of the semiconductor wafer 100. The vacuum chuck 601 may then reduce the air pressure against the back side of the semiconductor wafer 100 using a vacuum pump 603 to pull a vacuum.

The reduced air pressure on the back side of the semiconductor wafer 100 generates an imbalance of pressures between the back side of the semiconductor wafer 100 and the front side of the semiconductor wafer 100. This imbalance of pressures generates a net force on the front side of the semiconductor wafer 100 which will hold the semiconductor wafer 100 against the vacuum chuck 601. This force then allows the semiconductor wafer 100 to be moved and manipulated by moving and manipulating the vacuum chuck 601.

Once the semiconductor wafer 100 has been placed against the vacuum chuck 601, the vacuum chuck 601 and semiconductor wafer 100 may be inverted and the conductive material 201 reflowed as described above with respect to FIG. 5. As an example, the vacuum chuck 601 and the semiconductor wafer 100 may be inverted such that the semiconductor wafer 100 is perpendicular with the pull of gravity, the conductive material 201 may be reflowed, and the pull of gravity helps the conductive material 201 to form the desired bump shape instead of being pulled down onto the conductive pillars 109. As such, a more uniform bump shape is formed by using the pull of gravity instead of fighting the pull of gravity.

Figure 7:
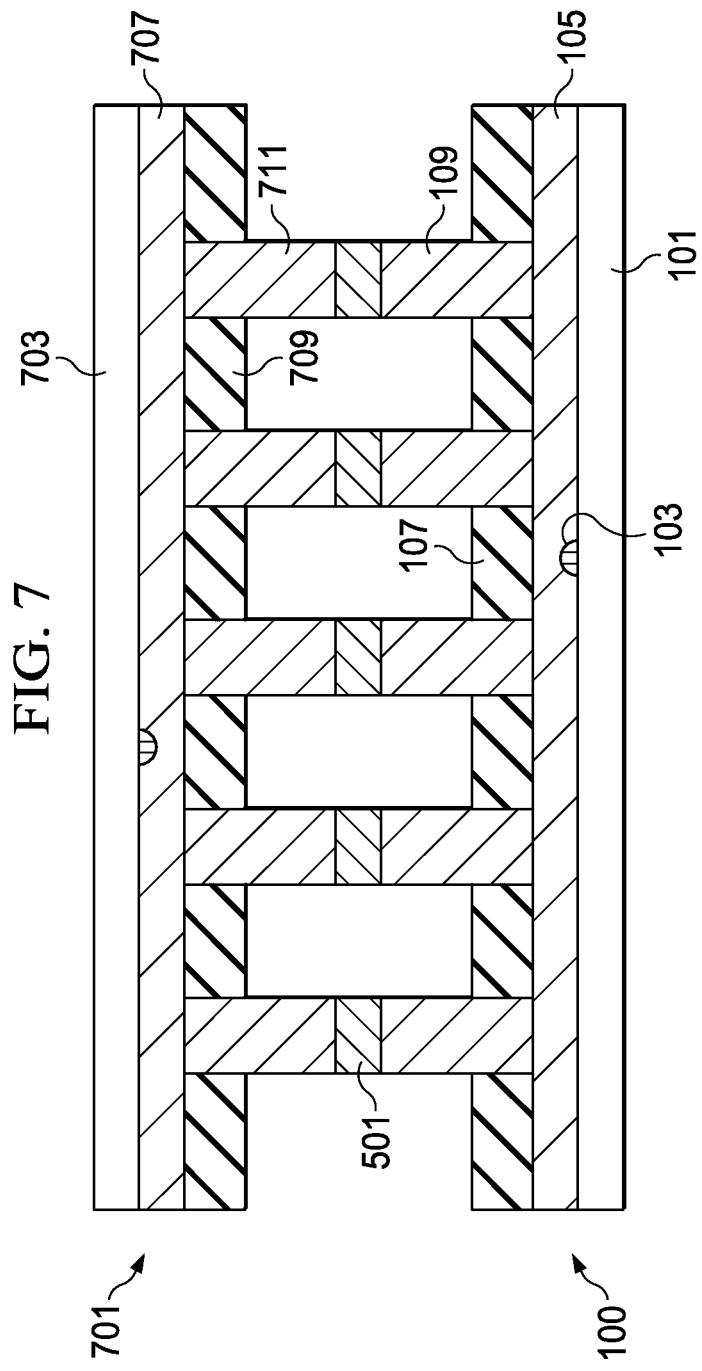
FIG. 7 illustrates the bonding of the semiconductor wafer with an external device in accordance with an embodiment.

FIG. 7 illustrates a bonding of the semiconductor wafer 100 to an external device 701. The external device 701 may be a semiconductor die connected to the semiconductor wafer 100 in a die-to-wafer bonding configuration, and the external device 701 may have external substrate 703, external active devices 705, external metallization layers 707, an external passivation layer 709, and external conductive pillars 711. However, the external device 701 is not limited to another semiconductor die, and may include other devices, such as a printed circuit board, a packaging substrate, or any other suitable device that provides a desired connection to the conductive pillars 109 through the conductive bumps 501.

In an embodiment in which the external device 701 is similar to the semiconductor wafer 100, the conductive bumps 501 (not shown in FIG. 7 but illustrated and described above with respect to FIG. 5) are aligned and placed in physical and electrical contact to the external conductive pillars 711 on the external substrate 703. Once the conductive bumps 501 are in physical contact with the external conductive pillars 711, a bonding process may be performed. The bonding process may include raising the temperature of the conductive bumps 501 so as to again reflow the conductive bumps 501 while simultaneously applying a pressure. The reflow allows the conductive bumps 501 to bond to the external conductive pillars 711, thereby bonding the semiconductor wafer 100 to the external device 701.

Alternatively, the semiconductor wafer 100 may be singulated prior to bonding with the external device 701. For example, the semiconductor wafer 100 may be sawed into a plurality of individual semiconductor dies (not explicitly shown in FIG. 7) that each have one or more of the conductive bumps 501. After the semiconductor wafer 100 has been singulated into one or more semiconductor dies, the semiconductor dies may be bonded to other external devices 701, such as another semiconductor die. The bonding process may be performed similar to the process described above with respect to FIG. 7, with the conductive bumps 501 being aligned with the external conductive pillars 711 and a reflow process being performed. This bonding process and any other suitable bonding process may alternatively be utilized, and all such bonding processes are fully intended to be included within the scope of the present invention.

By forming the conductive bumps 501 in conjunction with the force of gravity instead of forming the conductive bumps 501 against gravity, the conductive bumps 501 are formed in a more uniform shape. This more uniform shape helps during the bonding process to avoid bridges and gaps that might otherwise occur. As such, a higher yield of bonded products may be attained.

In accordance with an embodiment, a method comprising providing a conductive material attached to a first surface of a semiconductor substrate, the semiconductor substrate overlying the conductive material, is provided. The conductive material is reflowed such that the conductive material is pulled in a first direction that is away from the semiconductor substrate.

In accordance with another embodiment, a method comprising forming a conductive material on a contact of a semiconductor substrate is provided. The semiconductor substrate is positioned such that the conductive material hangs from the contact, and the conductive material is reflowed to form conductive bumps while the conductive material hangs from the contact.

In accordance with yet another embodiment, a method comprising forming a conductive material on a contact of a semiconductor substrate is provided. The semiconductor substrate is placed on a chuck and the chuck is used to position the semiconductor substrate such that gravity is pulling the conductive material in a direction away from the contact. The conductive material is reflowed while gravity is pulling the conductive material in a direction away from the contact, the reflowing the conductive material forming a conductive bump.

Although the embodiments and their advantages have been described in detail, it should be understood that various changes, substitutions and alterations can be made herein without departing from the spirit and scope of the embodiments as defined by the appended claims. For example, the precise type of equipment to be utilized in the handling of the semiconductor wafer may be varied. Additionally, different materials for the conductive pillars and the conductive material may alternatively be utilized in the formation of the conductive bumps.

Moreover, the scope of the present application is not intended to be limited to the particular embodiments of the process, machine, manufacture, composition of matter, means, methods and steps described in the specification. As one of ordinary skill in the art will readily appreciate from the disclosure of the present embodiments, processes, machines, manufacture, compositions of matter, means, methods, or steps, presently existing or later to be developed, that perform substantially the same function or achieve substantially the same result as the corresponding embodiments described herein may be utilized according to the present embodiments. Accordingly, the appended claims are intended to include within their scope such processes, machines, manufacture, compositions of matter, means, methods, or steps.

What is claimed is:

1. A method comprising:
   providing a conductive material attached to a first surface of a semiconductor substrate, the semiconductor substrate overlying the conductive material; and
   placing the semiconductor substrate into a chuck, wherein the chuck comprises a bottom portion adjacent a second surface of the semiconductor substrate and a top portion adjacent to the first surface of the semiconductor substrate;
   reflowing the conductive material such that the conductive material is pulled in a first direction that is away from the semiconductor substrate.

2. The method of claim 1, wherein the conductive material is solder.

3. The method of claim 1, further comprising inverting the chuck such that the semiconductor substrate is between the chuck and a ground.

4. The method of claim 1, wherein the chuck is a vacuum chuck.

5. The method of claim 1, wherein the first direction is perpendicular to the first surface.

6. The method of claim 1, wherein the providing the conductive material further comprises:
   forming a conductive pillar on the semiconductor substrate; and
   forming the conductive material onto the conductive pillar.

7. A method comprising:
   forming a conductive material on a contact of a semiconductor substrate;
   placing the semiconductor substrate into a chuck, wherein the chuck comprises a first portion adjacent to a first surface of the semiconductor substrate and a second portion adjacent to a second surface of the semiconductor substrate;
   positioning the semiconductor substrate such that the conductive material hangs from the contact; and
   reflowing the conductive material to form conductive bumps while the conductive material hangs from the contact.

8. The method of claim 7, wherein the positioning the semiconductor substrate further comprises positioning the conductive material such that gravity applies a force to the conductive material, the force being directed away from the contact.

9. The method of claim 7, further comprising:
contacting the conductive bumps to an external substrate; and
reflowing the conductive bumps to bond the contact to the external substrate.

10. The method of claim 7, wherein the conductive material is solder.

11. The method of claim 7, wherein the contact is located on a first surface of the semiconductor substrate, and wherein the chuck comprises a portion that overlies the first surface of the semiconductor substrate.

12. The method of claim 7, wherein the chuck is a vacuum chuck.

13. A method comprising:
forming a conductive material on a contact of a semiconductor substrate;
placing the semiconductor substrate onto a first portion of the chuck;
attaching a second portion of the chuck to the first portion of the chuck, wherein the second portion of the chuck is adjacent to the semiconductor substrate;
using the chuck to position the semiconductor substrate such that gravity is pulling the conductive material in a direction away from the contact; and
reflowing the conductive material while gravity is pulling the conductive material in a direction away from the contact, the reflowing the conductive material forming a conductive bump.

14. The method of claim 13, wherein the chuck is a vacuum chuck.

15. The method of claim 13, wherein the conductive material is solder.

16. The method of claim 13, further comprising:
contacting a second substrate to the conductive bump; and
reflowing the conductive bump to bond the contact to the second substrate.

* * * * *